United States Patent
Kanaya

(10) Patent No.: US 12,283,581 B2
(45) Date of Patent: Apr. 22, 2025

(54) DISPLAY DEVICE

(71) Applicant: Japan Display Inc., Tokyo (JP)

(72) Inventor: Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 701 days.

(21) Appl. No.: 17/454,535

(22) Filed: Nov. 11, 2021

(65) Prior Publication Data

US 2022/0068902 A1 Mar. 3, 2022

Related U.S. Application Data

(63) Continuation of application No. PCT/JP2020/016341, filed on Apr. 13, 2020.

(30) Foreign Application Priority Data

May 13, 2019 (JP) .................... 2019-090813

(51) Int. Cl.
*H01L 25/16* (2023.01)
*H01L 27/12* (2006.01)
*H01L 33/40* (2010.01)

(52) U.S. Cl.
CPC .......... *H01L 25/167* (2013.01); *H01L 27/124* (2013.01); *H01L 33/40* (2013.01)

(58) Field of Classification Search
CPC ..... H01L 25/167; H01L 27/124; H01L 33/40; H01L 25/0753; H01L 33/62; H01L 23/12; G09F 9/30; G09F 9/302; G09F 9/33
See application file for complete search history.

(56) References Cited

U.S. PATENT DOCUMENTS

| | | | |
|---|---|---|---|
| 6,900,470 B2 * | 5/2005 | Kobayashi | H10K 59/80518 257/40 |
| 10,090,335 B2 | 10/2018 | Kang et al. | |
| 10,452,182 B2 * | 10/2019 | Matsueda | G06F 3/0446 |
| 10,796,627 B2 * | 10/2020 | Pan | H01S 5/021 |
| 11,107,399 B2 * | 8/2021 | Yanase | H10K 59/35 |
| 2002/0158835 A1 | 10/2002 | Kobayashi et al. | |
| 2007/0029929 A1* | 2/2007 | Nakamura | H10K 59/80522 313/506 |

(Continued)

FOREIGN PATENT DOCUMENTS

| | | |
|---|---|---|
| JP | S5317396 B | 6/1978 |
| JP | 63-120287 U | 8/1988 |

(Continued)

OTHER PUBLICATIONS

Office Action issued on Feb. 14, 2023, in corresponding Japanese Application No. 2019090813, 14 pages.

(Continued)

*Primary Examiner* — Kyoung Lee
*Assistant Examiner* — Sophia W Kao
(74) *Attorney, Agent, or Firm* — Maier & Maier, PLLC

(57) ABSTRACT

According to one embodiment, a display device includes a substrate, a light-emitting element mounted on the substrate, an anode terminal disposed on an bottom portion of the light-emitting element and a cathode terminal disposed on an emitting surface of the light emitting element, on an opposite side to the anode terminal, and the cathode terminal is formed of a metal material.

7 Claims, 7 Drawing Sheets

(56) References Cited

U.S. PATENT DOCUMENTS

2013/0015483 A1* 1/2013 Shimokawa ............ H01L 24/96
                                                                          257/E33.072
2018/0190672 A1* 7/2018 Lee ...................... H01L 27/156
2019/0355786 A1 11/2019 Iguchi

FOREIGN PATENT DOCUMENTS

| JP | 2002-318556 A | 10/2002 |
| JP | 200619142 A | 1/2006 |
| JP | 2007-073499 A | 3/2007 |
| JP | 2013-021175 A | 1/2013 |
| JP | 2019-204823 A | 11/2019 |

OTHER PUBLICATIONS

International Search Report issued Jun. 23, 2020 in PCT/JP2020/016341 filed on Apr. 13, 2020, 3 pages.
Taiwanese Office Action issued Mar. 24, 2021 in Taiwanese Application No. 109115858, 5 pages.

* cited by examiner

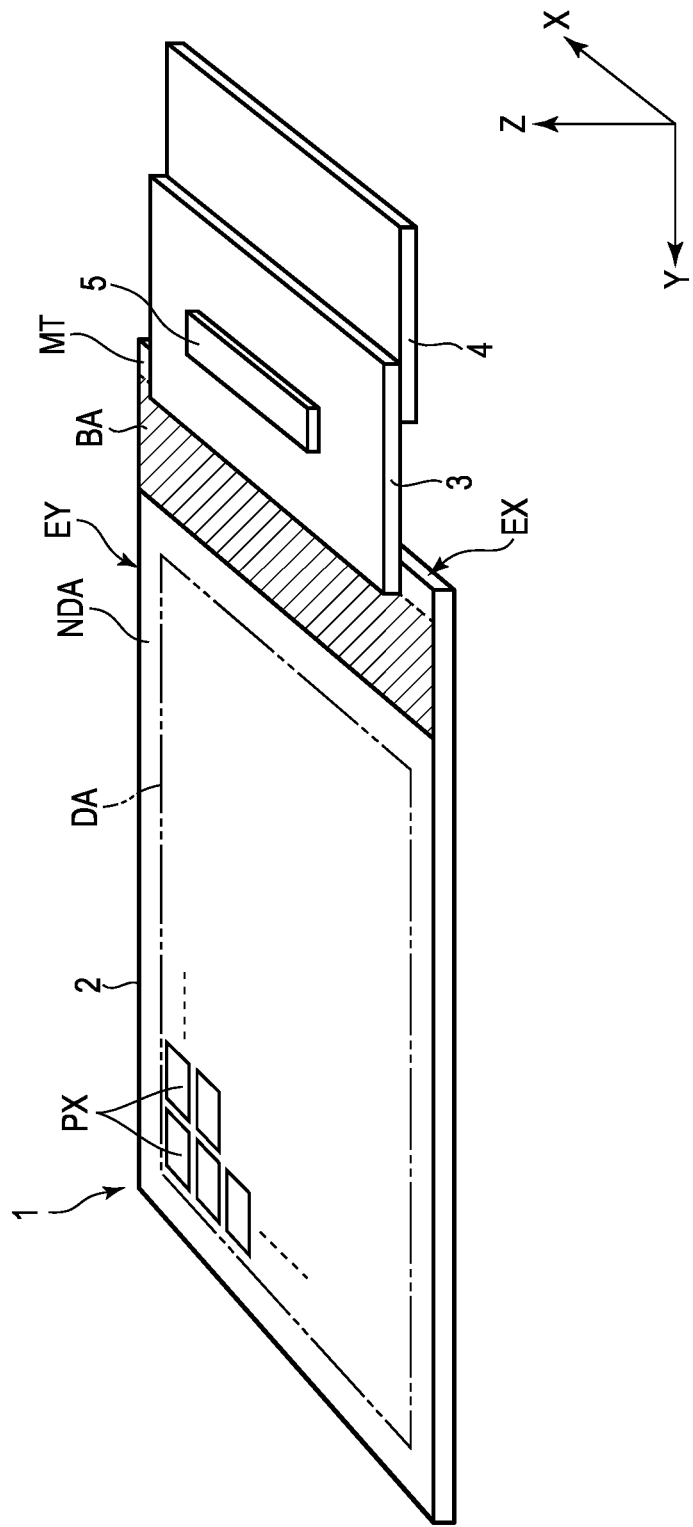
F I G. 1

DISPLAY DEVICE

CROSS-REFERENCE TO RELATED APPLICATIONS

This application is a Continuation Application of PCT Application No. PCT/JP2020/016341, filed Apr. 13, 2020 and based upon and claiming the benefit of priority from Japanese Patent Application No. 2019-090813, filed May 13, 2019, the entire contents of all of which are incorporated herein by reference.

FIELD

Embodiments described herein relate generally to a display device.

BACKGROUND

LED displays using light-emitting diodes (LED), which are spontaneous light-emitting elements, are known, but in recent years, as display devices with higher resolution, display devices using micro diode elements called micro LEDs (hereinafter referred to as micro LED displays) has been developed.

Unlike conventional liquid crystal displays or organic EL displays, the micro LED displays are formed by mounting a large number of chip-shaped micro LEDs in the display area, which makes it easy to achieve both high resolution and large size, and are attracting attention as a next-generation displays.

Some micro LEDs comprise an anode terminal (positive electrode) and a cathode terminal (negative electrode) disposed to oppose each other while interposing a light-emitting layer therebetween. Such micro LEDs emit light when a voltage is applied to the anode and cathode terminals.

In general, the cathode terminal is disposed on a light-emitting surface side and, in many cases, is made of a transparent conductive material in terms of the light extraction efficiency. Further, the cathode terminal described above is, in many cases, formed continuously over multiple pixels and connected to a power wiring line in a peripheral portion (non-display area) where micro LEDs are not disposed.

However, in such a case, a voltage drop may occur based on the resistance of the transparent conductive material, and the voltage applied to the cathode terminal may be lower in the micro-LEDs as the location thereof is farther from the power wiring line described above.

BRIEF DESCRIPTION OF THE DRAWINGS

FIG. 1 is a perspective view schematically showing a configuration of a display device of an embodiment.

DETAILED DESCRIPTION

Figure 2:
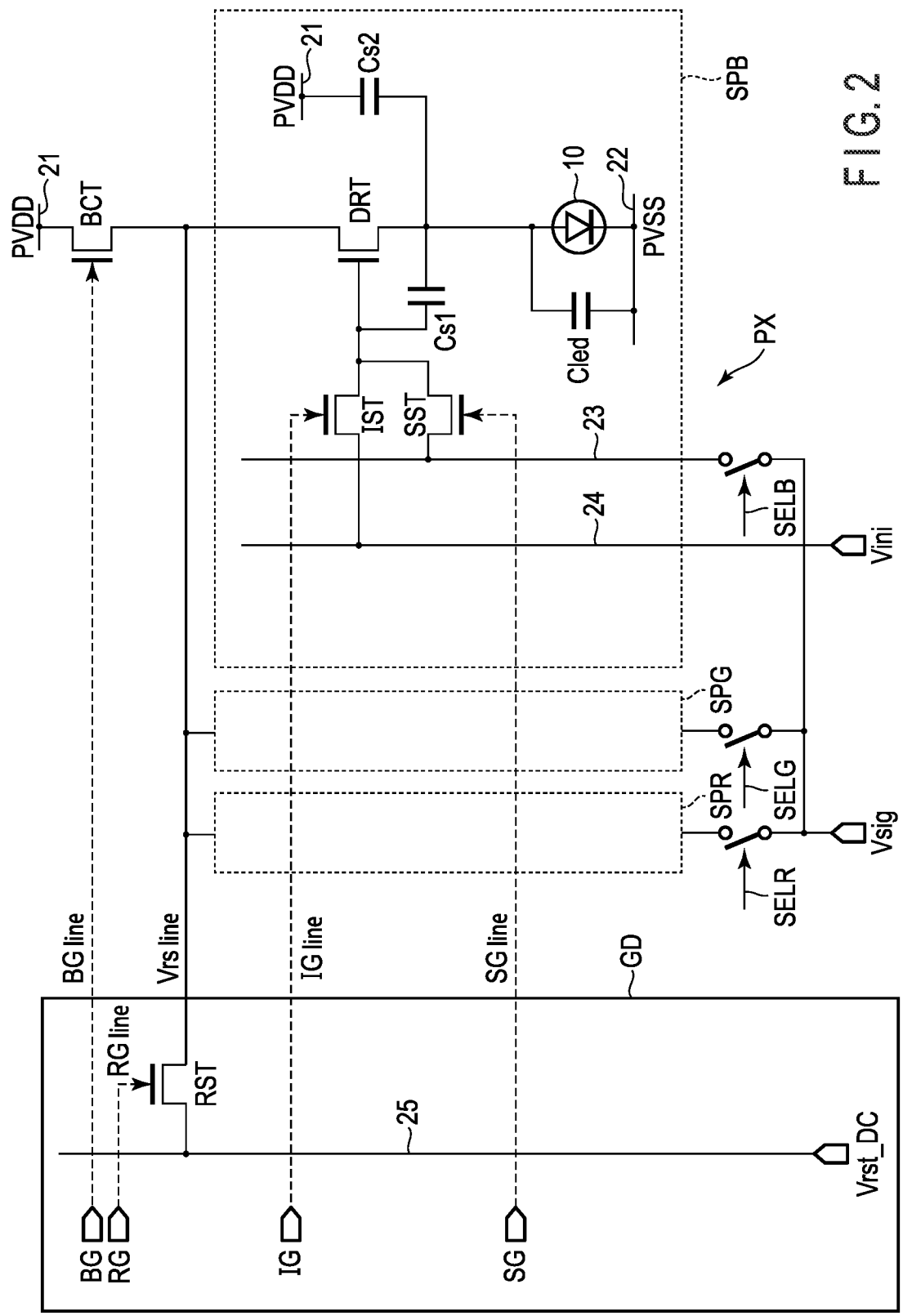
FIG. 2 is a diagram showing an example of the circuit configuration of the display device of the embodiment.

In general, according to one embodiment, a display device comprises a substrate, a light-emitting element mounted on the substrate, an anode terminal disposed on an bottom portion of the light-emitting element and a cathode terminal disposed on an emitting surface of the light emitting element, on an opposite side to the anode terminal, and the cathode terminal is formed of a metal material.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the structures are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and redundant explanations may be omitted.

FIG. 1 is a perspective view schematically showing a configuration of a display device 1 in this embodiment. FIG. 1 shows a three-dimensional space defined by a first direction X, a second direction Y orthogonal to the first direction X and a third direction Z orthogonal to the first direction X and the second direction Y. Note that the first direction X and the second direction Y are orthogonal to each other, but may intersect at an angle other than ninety degrees. Further, in the following descriptions, the third direction Z is referred to as "upward" and a direction opposite to the third direction is referred to as "downward". With such expressions "a second member above a first member" and "a second member below a first member", the second member may be in contact with the first member or may be remote from the first member.

In the following descriptions, the case where the display device 1 is a micro-LED display device (micro-LED display) using micro-LEDs, which are spontaneous light-emitting elements, will be mainly described.

As shown in FIG. 1, the display device 1 comprises a display panel 2, a first circuit board 3, a second circuit board 4 and the like.

The display panel 2 is, for example, rectangular in shape in. In the example illustrated in the figure, a short side EX of the display panel 2 is parallel to the first direction X, and a long side EY of the display panel 2 is parallel to the second direction Y. The third direction Z corresponds to the thickness direction of the display panel 2. The first direction X may be referred to as a direction parallel to a short edge EX of the display device 1, the second direction Y may be referred to as a direction parallel to a long edge EY of the display device 1, and the third direction Z may be referred to as the thickness direction of the display device 1. A main surface of the display panel 2 is parallel to an X-Y plane defined by the first direction X and the second direction Y. The display panel 2 includes a display area DA and a non-display area NDA on an outer side of the display area DA. The non-display area NDA includes a terminal area MT. In the example illustrated in the figure, the non-display area NDA surrounds the display area DA.

The display area DA is an area which displays images and comprises a plurality of pixels PX arranged in a matrix, for example. The pixels PX each include a light-emitting element (micro-LED) and a switching element (drive transistor) for driving the light-emitting element.

The terminal area MT is provided along the short side EX of the display panel 2 and includes terminals which electrically connects the display panel 2 to an external device or the like.

The first circuit board 3 is mounted on a terminal region MT and is electrically connected to the display panel 2. The first circuit board 3 is, for example, a flexible printed circuit board. The first circuit board 3 comprises a drive IC chip (hereinafter referred to as a panel driver) 5 and the like, which drive the display panel 2. In the example illustrated in the figure, the panel driver 5 is placed above the first circuit board 3, but it may be placed below. Or, the panel driver 5 may be mounted on a member other than the first circuit board 3, for example, on the second circuit board 4. The second circuit board 4 is, for example, a flexible printed circuit board. The second circuit board 4 is connected to the first circuit board 3, for example, below the first circuit board 3.

The panel driver 5 described above is connected to a control board (not shown) via the second circuit board 4, for example. The panel driver 5 executes the control which displays images on the display panel 2 by driving a plurality of pixels PX based on video signals output from the control board, for example.

Note that the display panel 2 may include a fold (bend) area BA, which is indicated by hatch lines. The bend area BA is an area that is bent when the display device 1 is housed in a housing such as an electronic device. The bend area BA is located on a terminal region MT side of the non-display area NDA. In the state where the bend area BA is bent, the first circuit board 3 and the second circuit board 4 are placed below the display panel 2 so as to oppose the display panel 2.

Next, with reference to FIG. 2, the circuit configuration of the display device 1 will be described. As mentioned above, a plurality of pixels PX are arranged in a matrix in the display area DA. The pixels PX have a similar configuration. Therefore, in FIG. 2, one of the pixels PX is shown to represent all. The pixel PX includes, for example, three sub-pixels SPR, SPG and SPB.

The sub-pixels SPR, SPG, and SPB have a similar configuration. Therefore, for the sake of convenience, the configuration of the sub-pixel SPB (pixel circuit) will be mainly described here. As shown in FIG. 2, the sub-pixel SPB includes a light-emitting element 10, a drive transistor DRT, a pixel transistor SST, a initialization transistor IST, a reset transistor RST, a storage capacitance Cs1 and an auxiliary capacitance Cs2. The gate driver GD includes the reset transistor RST. Note that the output transistor BCT shown in FIG. 2 is provided for the sub-pixels SPR, SPG and SPB in each pixel. In FIG. 2, each transistor is of an n-channel type. An element capacitance Cled shown in FIG. 2 is the capacitance between an anode electrode and a cathode electrode of the light-emitting element 10. Note that the reset transistor RST, the pixel transistor SST, the initialization transistor IST and the output transistor BCT may not necessarily be constituted by transistors, respectively. The reset transistor RST, the pixel transistor SST, the initialization transistor IST and the output transistor BCT may be any members as long as they function as a reset switch, a pixel switch, and an output switch, respectively. A Vrst line functions as a reset wiring line, and a BG line, an RG line, an IG line, an SG line each function as ta control wiring line.

In the following descriptions, one of source and drain terminals of the transistor is referred to as the first terminal and the other as the second terminal. Further, one of the terminals which form the element capacitance is referred to as the first terminal and the other as the second terminal.

The first terminal of the drive transistor DRT is connected to the first terminal of the element capacitance Cled, the first terminal of the storage capacitance Cs1, and the first terminal of the auxiliary capacitance Cs2. The second terminal of the drive transistor DRT is connected to the first terminal of the output transistor BCT. The second terminal of the drive transistor DRT is connected to the first terminal of the reset transistor RST via the Vrst line.

The second terminal of the output transistor BCT is connected to a first main power line 21. The second terminal of the element capacitance Cled is connected to a second main power line 22.

The first terminal of the pixel transistor SST is connected to the gate terminal of the drive transistor DRT, the first terminal of the initialization transistor IST, and the second terminal of the storage capacitance Cs1. The second terminal of the pixel transistor SST is connected to a pixel signal line 23.

The second terminal of the initialization transistor IST is connected to an initialization power line 24. The second terminal of the auxiliary capacitance Cs2 is connected to the first main power line 21. It suffices if the second terminal of the auxiliary capacitance Cs2 is connected to a constant potential line, and may be connected to a wiring line other than the first main power line 21.

Here, the reset transistor RST is provided in the gate driver GD located outside the sub-pixel SPB (pixel PX), and the second terminal of the reset transistor RST is connected to a reset power line 25.

Here, a first power potential PVDD is supplied to the first main power line 21, and a second power potential PVSS is supplied to the second main power line 22. The first power potential PVDD corresponds to the voltage for supplying an anode voltage to the light-emitting element 10, and the second power potential PVSS corresponds to a cathode voltage of the light-emitting element 10. Note that the second main power line 22 may be referred to as a common power wiring line (or simply power wiring line).

Moreover, a pixel signal Vsig is supplied to the pixel signal line 23, an initialization voltage Vini is supplied to the initialization power line 24, and the reset power line 25 is set to the reset power potential Vrst. The pixel signal Vsig is a signal that is written to the pixel (in this case, the sub-pixel SPB) based on the video signal described above.

The gate terminal of the output transistor BCT is connected to the BG line. To the BG line, an output control signal BG is supplied.

The gate terminal of the pixel transistor SST is connected to the SG line. To the SG line, a pixel control signal SG is supplied.

The gate terminal of the initialization transistor IST is connected to the IG line. To the IG line, an initialization control signal IG is supplied.

The gate terminal of the reset transistor RST is connected to the RG line. To the RG line, a reset control signal RG is supplied.

In FIG. 2, all the transistors described above are assumed to be n-channel transistors, but for example, transistors other than the drive transistor DRT may be p-channel transistors, or n-channel and p-channel transistors may be mixedly present.

Further, it suffices if the display device 1 includes at least one gate driver GD. Although not illustrated in the figure for this embodiment, the display device 1 comprises two gate drivers GD. The gate drivers GD are provided not only on the left side of the pixel PX in FIG. 2, but also on the right side of the pixel PX. With this structure, it is possible to provide signals from both sides of the gate driver GD to a single pixel PX. Here, it is assumed that the above-described SG line is fed from both sides, while the other BG line, IG line, Vrst line and the like are fed from one side.

In the above, the configuration of the sub-pixel SPB is described, but the same descriptions apply to sub-pixels SPR and SPG as well.

The circuit configuration described in FIG. 2 is only an example, and the circuit configuration of the display device 1 can take some other structure as long as it includes at least a drive transistor DRT. For example, part of the circuit configuration described in connection with FIG. 2 may be omitted, or some other configuration may be added.

Figure 3:
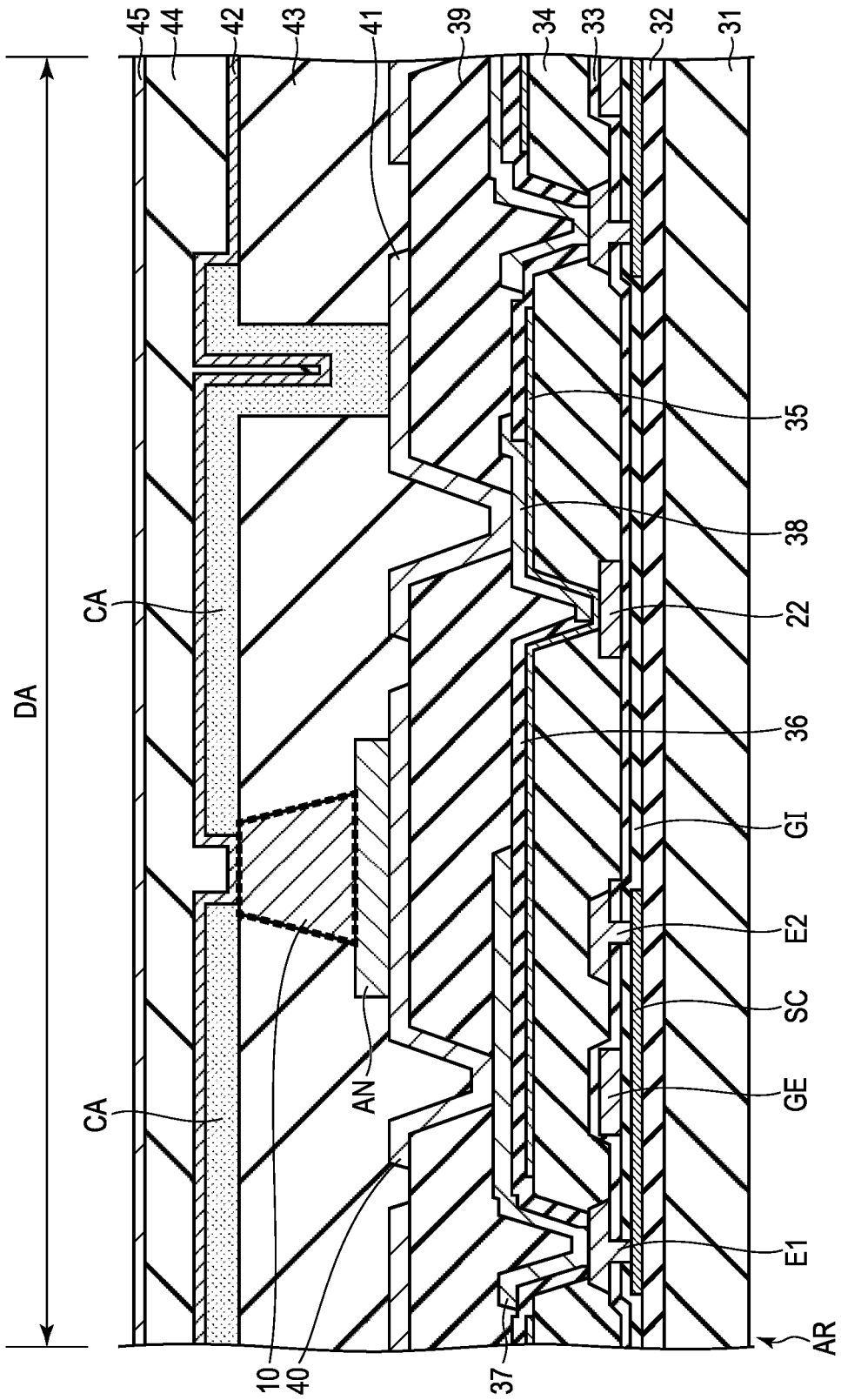
FIG. 3 is a diagram schematically showing an example of a cross-sectional structure of the display device of the embodiment.

FIG. 3 schematically illustrates a cross-sectional structure of the display device 1. Here, an example in which a minute light-emitting diode element called micro LED as described above, is mounted on the substrate as a display element, will be described. Note that in FIG. 3, the display area DA comprising thin film transistors (TFTs) that constitute the pixels is shown.

The array substrate AR of the display panel 2 shown in FIG. 3 comprises an insulating substrate 31. The insulating substrate 31 may be made of any material as long as it can withstand the processing temperature during the TFT process, but mainly a glass substrate such as of quartz or alkali-free glass, or a resin substrate such as of polyimide can be used. Resin substrates are flexible and can be used to construct a display device 1 as a sheet display. The resin substrate is not limited to polyimide, but other resin materials can be used as well. In view of the above, it may be more appropriate to refer to the insulating substrate 31 as an organic insulating layer or a resin layer.

On the insulating substrate 31, an undercoat layer 32 of a three-layer structure is provided. Although the details are not shown in the figure, the undercoat layer 32 includes a lower layer formed of silicon oxide (SiO2), a middle layer formed of silicon nitride (SiN), and an upper layer formed of silicon oxide (SiO2). In the undercoat layer 32, the lower layer is provided to improve adhesion to the insulating substrate 31, which is the base material, the middle layer is provided as a film for blocking moisture and impurities from outside, and the upper layer is provided as a blocking film to prevent hydrogen atoms contained in the middle layer from diffusing to a semiconductor layer SC side, which will be described later. The undercoat layer 32 may be further stacked, or may have a single- or a double-layer structure. For example, if the insulating substrate 31 is glass, the silicon nitride film may be formed directly on the insulating substrate 31 because the silicon nitride film has relatively good adhesion.

On the insulating substrate 31, light-shielding layers (not shown) are provided. The positions of the light-shielding layers are respectively aligned with the locations where the TFTs are to be formed later. The light-shielding layers can be made of a light-shielding material such as a metal layer or a black layer. The light-shielding layers can inhibit light from entering a rear side of the channels of the TFTs, thus making it possible to suppress the change in TFT characteristics, which may be caused by light entering from the insulating substrate 31 side. Note that in the case where the light-shielding layers are formed from a conductive layer, it is possible to impart a back gate effect to the TFTs by applying a predetermined potential to the light-shielding layers.

TFTs (for example, drive transistors DRT) are formed on the undercoat layer 32 described above. As an example of the TFT; a polysilicon TFT using polysilicon as the semiconductor layer SC is used. In this embodiment, the semiconductor layer SC is formed by using low-temperature polysilicon. The TFT may be either NchTFT or PchTFT. Or, NchTFT and PchTFT can be formed simultaneously. In the following descriptions, an example in which NchTFT is used as the drive transistor DRT will be described. The semiconductor layer SC of the NchTFT includes a first region, a second region, a channel region between the first and second regions, and low-concentration impurity regions respectively provided between the channel region and the first region, and between the channel region and the second region. One of the first and second regions functions as a source region, and the other functions as a drain region. The gate insulating film GI is made of silicon oxide film, and the gate electrode GE is made of molybdenum tungsten (MoW). The electrodes formed on the gate insulating film GI, such as the gate electrode GE, may be referred to as a first wiring or a first metal. In addition to its function as a gate electrode of the TFT, the gate electrode GE also has a function as a storage capacitive electrode as will be described below. Here, a top-gate TFT is described as an example, but the TFT may as well be of a bottom-gate type.

On the gate insulating film GI and the gate electrode GE, an interlayer insulating film 33 is provided. The interlayer insulating film 33 is configured such that for example, a silicon nitride film and a silicon oxide film are stacked in order on the gate insulating film GI and the gate electrode GE.

On the interlayer dielectric film 33, a first electrode E1 and a second electrode E2, which are TFTs, are provided. Further, on the interlayer insulating film 33, the common power wiring line 22 is provided. The first electrode E1, the second electrode E2, and the common power wiring line 22 each adopt a three-layer structure (Ti-based material/Al-based material/Ti-based material), which includes a lower layer made of titanium (Ti) or a Ti-based metal material which contains Ti as a main component, such as a Ti-containing alloy, a middle layer made of aluminum (Al) or an Al-based metal material which contains Al as a main component, such as an Al-containing alloy, and a lower layer made of Ti or a Ti-based metal material which contains Ti as a main component, such as a Ti-containing alloy. Note that the electrodes formed on the interlayer insulating film 33, which include the first electrode E1, may be referred to as a second wiring line or a second metal. The first electrode E1 is connected to the first region of the semiconductor layer SC, and the second electrode E2 is connected to the second region of the semiconductor layer SC. For example, when the first region of the semiconductor layer SC functions as a source region, the first electrode E1 is a source electrode and the second electrode E2 is a drain electrode. The first electrode E1 forms the storage capacitance Cs1 together with the interlayer insulating film 33 and the gate electrode (storage capacitance electrode) GE of the TFT.

On the interlayer insulating film 33, the first electrode E1, the second electrode E2 and the common power wiring line 22, a planarization film 34 is formed to cover the TFT and the common power wiring line 22. For the planarization film 34, organic insulating materials such as photosensitive acrylics are often used, which has superior coverage of wiring steps and surface planarization, as compared to inorganic insulating materials formed by CVD or the like.

On the planarization film 34, a conductive layer 35 is provided. As will be described later, the conductive layer 35 is not formed in the region where the first electrode E1 of the TFT and the pixel electrode 37 (anode electrode) are in contact with each other, but comprises an opening in this region. On the conductive layer 35, an insulating layer 36 is provided. For example, the insulating layer 36 is made of silicon nitride film. A pixel electrode 37 is provided on the insulating layer 36. The pixel electrode 37 is in contact with the first electrode E1 of the TFT via an opening to be formed in the planarization film 34 and the insulating layer 36. With this structure, the pixel electrode 37 is electrically connected to the first electrode E1 of the TFT via the opening. Both the conductive layer 35 and the pixel electrode 37 are formed of a transparent conductive material such as indium tin oxide (ITO) or indium zinc oxide (IZO).

The above-described TFTs and the pixel electrode 37 may be collectively referred to as anode wiring lines.

The conductive layer 35 is in contact with the common power wiring line 22 via the opening formed in the planarization film 34. In the region where the conductive layer 35 and the common power wiring line 22 are in contact with each other, a common electrode 38 (cathode electrode) is provided on the conductive layer 35. With this structure, the common electrode 38 is electrically connected to the common power wiring line 22 via the conductive layer 35. The common electrode 38 is formed of, for example, a transparent conductive material such as ITO or IZO as in the case of the conductive layer 35 and the pixel electrode 37.

Note that the common power wiring line 22, the conductive layer 35 and the common electrode 38 may be collectively referred to as cathode wiring lines.

In addition, the material for the pixel electrode 37 and the common electrode 38 is not limited to those transparent conductive materials listed above, but may as well be formed of a light-shielding metal material such as aluminum (Al), titanium (Ti), molybdenum (Mo) or tungsten (W), or from a stacked structure of any of these metal materials.

On the insulating layer 36, the pixel electrodes 37 and the common electrodes 38, a planarization film 39 is provided. The planarization film 39 is formed of an organic insulating material such as photosensitive acryl. The planarization film 39 includes an opening for electrically connecting the pixel electrode 37 and a first relay electrode 40 (an anode relay electrode) to each other and an opening for electrically connecting the common electrode 38 and a second relay electrode 41 (a cathode relay electrode) to each other.

As described above, two planarization films 34 and 39 are provided in the display device 1. Here, the planarization films 34 and 39 have a thickness (film thickness) in the third direction Z as compared to the insulating layer formed of an inorganic insulating material. Therefore, as compared to the case where at least one of the planarization films 34 and 39 is an insulating layer formed by an inorganic insulating material, excellent cushioning properties can be obtained as an advantage.

In the display area DA, the light-emitting element 10 is mounted. FIG. 3 shows only one light-emitting element 10, but in reality, light-emitting elements 10 which respectively emit R, G and B colors are provided. The light-emitting element 10 and the first relay electrode 40 are electrically connected by an anode terminal AN. The anode terminal AN is a connection member, which is, for example, a solder material.

The light-emitting element 10 is in contact with a cathode terminal CA at both ends of the emitting surface on an opposite side of the anode terminal AN located at the bottom. In more detail, the light-emitting element 10 and the cathode terminal CA overlap each other, for example, by 1 μm in the ends of the emitting surface so as to be in contact with each other. Here, it is preferable that the cathode terminal CA be made of, for example, a metal material such as titanium (Ti) or a blackened metal. With this configuration, it can be expected to improve the contrast of the display device 1 in bright locations.

The cathode terminal CA is in contact with the second relay electrode 41 via an opening formed in an element insulating layer 43, which will be described later. That is, the second relay electrode 41 electrically connected to the cathode terminal CA is located in the same layer as that of the anode terminal AN (and the first relay electrode 40 electrically connected to the anode terminal AN).

A transparent conductive layer 42 is provided so as to cover the cathode terminal CA and the portion of the emitting surface of the light-emitting element 10, which does not overlap the cathode terminal CA. For the transparent conductive layer 42, a transparent conductive material such as ITO or IZO can be used. Thus, with the configuration that the transparent conductive layer 42 is provided on the portion of the emitting surface of the light-emitting element 10, which does not overlap the cathode terminal CA, light can be extracted from the light-emitting element 10. Note that in this embodiment, the transparent conductive layer 42 does not basically function as a cathode terminal, the transparent conductive layer 42 can be omitted. On the other hand, with the transparent conductive layer 42 provided, it can be expected to improve the redundancy properties. Further, as will be described later, the transparent conductive layer 42 may include a recess potion which has a different thickness from the other parts as shown in FIG. 3 in a potion where a cathode terminal CA and another cathode terminal CA extending from the adjacent sub-pixel intersect each other.

An element insulating layer 43 is provided between the planarization film 39 and the cathode terminal CA and the transparent conductive layer 42. The element insulating layer 43 is formed of a resin material that is filled in voids between the light-emitting elements 10.

On the transparent conductive layer 42, a planarization film 44 is provided and on the planarization film 44, a polarizer 45 is provided. The planarization film 44 is formed of an organic insulating material such as photosensitive acryl. The polarizer 45 is adhered onto the planarization film 44 by an adhesive layer not shown in the figure.

Figure 4:
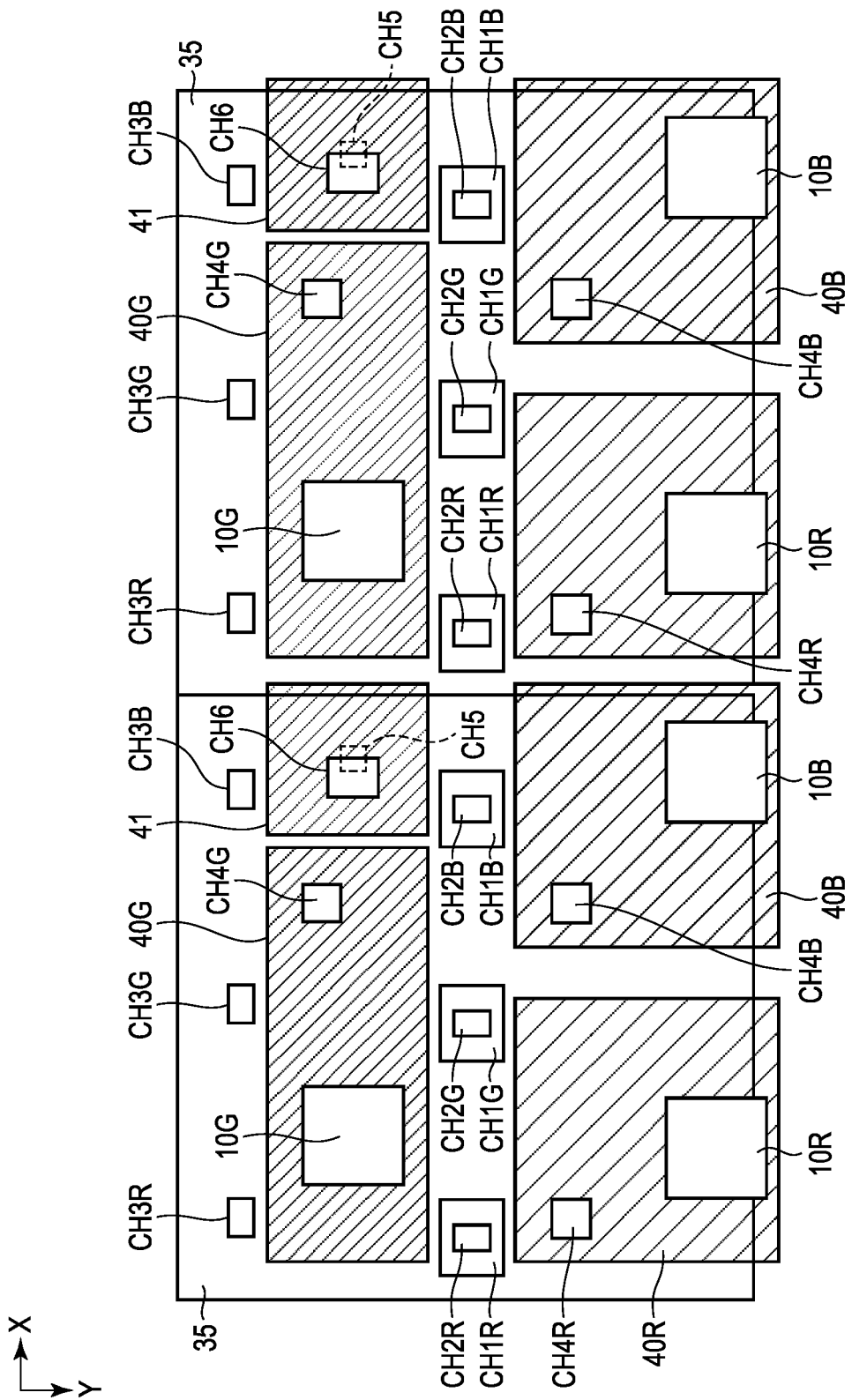
FIG. 4 is a plan view schematically showing an example of a pixel structure of the display device of the embodiment.

FIG. 4 is a plan view illustrating positions of openings (contact portions) formed in the pixel PX (sub-pixels SPR, SPG and SPB) in this embodiment. In FIG. 4, to prevent the complication of the illustration, only the necessary elements are illustrated and some elements are omitted.

As shown in FIG. 4, the pixel PX, which includes sub-pixels SPR, SPG and SPB, shares a single conductive layer 35. In other words, the conductive layer 35 is formed to extend continuously over the multiple sub-pixels SPR, SPG and SPB.

In the following descriptions, elements contained in the sub-pixel SPR will be referred to by further adding "R" at the ends of the reference numerals thereof, for explanation. Elements contained in the sub-pixel SPG will be referred to by adding "G" at the ends of the reference numerals thereof, and elements contained in the sub-pixel SPB will be referred to by adding "B" at the ends of the reference numerals thereof, for explanation.

As shown in FIG. 4, the sub-pixels SPR, SPG, and SPB included in the pixel PX, each comprise openings CH1 to CH4. Further, as shown in FIG. 4, openings CH5 and CH6 as well are formed in each pixel PX.

An opening CH1R corresponds to a region where the conductive layer 35 is not formed in order to make a pixel electrode 37R and a first electrode E1R in contact with each other in an opening CH2R, which will be described later. Further, an opening CH1G corresponds to a region where the conductive layer 35 is not formed in order to made a pixel electrode 37G and a first electrode E1G in contact with each other in an opening CH2G, which will be described later. Furthermore, an opening CH1B corresponds to a region where the conductive layer 35 is not formed in order to make a pixel electrode 37B and a first electrode E1B in contact with each other in an opening CH2B, which will be described later.

The opening CH2R is an opening formed in the planarization film 34 and the insulating layer 36 so as to make the pixel electrode 37R and the first electrode E1R in contact with each other. Further, the opening CH2G is an opening formed in the planarization film 34 and the insulating layer 36 so as to make the pixel electrode 37G and the first electrode E1G in contact with each other. Furthermore, the opening CH2B is an opening formed in the planarization film 34 and the insulating layer 36 so as to make the pixel electrode 37B and the first electrode E1B in contact with each other.

As shown in FIG. 4, the opening CH1R is formed larger in size than the opening CH2R, and the opening CH1R and the opening CH2R overlap each other in planar view. Similarly, the opening CH1G is formed larger in size than the opening CH2G, and the opening CH1G and the opening CH2G overlap each other in planar view. Further, the opening CH1B is formed larger in size than the opening CH2B, and the opening CH1B and the opening CH2B overlap each other in planar view.

Further, as shown in FIG. 4, the openings CH1R and CH2R, the openings CH1G and CH2G, and the openings CH1B and CH2B are arranged substantially in a straight line along the first direction X.

The opening CH3R is an opening formed in the planarization film 34 so as to make the conductive layer 35 and the common power wiring line 22 in contact with each other. Further, the opening CH3G is an opening formed in the planarization film 34 so as to make the conductive layer 35 and the common power wiring line 22 in contact with each other. Furthermore, the opening CH3B is an opening formed in the planarization film 34 so as to make the conductive layer 35 and the common power wiring line 22 in contact with each other.

As shown in FIG. 4, the openings CH3R, CH3G and CH3B are aligned substantially in a straight line along the first direction X.

Further, as shown in FIG. 4, the openings CH1R and CH2R and the opening CH3R are aligned substantially in a straight line along the second direction Y. Similarly, the openings CH1G and CH2G and the opening CH3G are aligned substantially in a straight line along the second direction Y, and the openings CH1B and CH2B and the opening CH3B are aligned substantially in a straight line along the second direction Y.

The opening CH4R is an opening formed in the planarization film 39 so as to make the pixel electrode 37R and the first relay electrode 40R in contact with each other. The opening CH4G is an opening formed in the planarization film 39 so as to make the pixel electrode 37G and the first relay electrode 40G in contact with each other. The opening CH4B is an opening formed in the planarization film 39 so as to make the pixel electrode 37B and the first relay electrode 40B in contact with each other.

In the example shown in FIG. 4, at least one of the openings CH4R, CH4G and CH4B is formed so that these openings are not aligned in a straight line. More specifically, the openings CH4R and CH4B are aligned in a straight line extending along the first direction X, whereas the opening CH4G is not aligned in the straight line extending in the first direction X. Further, the openings CH4G and CH4B are aligned in a straight line extending in the second direction Y, whereas the opening CH4R is not aligned in the straight line extending in the second direction Y.

The opening CH5 is an opening formed in the planarization film 39 to make the common electrode 38 and the second relay electrode 41 in contact with each other. The opening CH6 is an opening formed in the element insulating layer 43 so as to make the second relay electrode 41 and the cathode terminal CA in contact with each other. Note that, as shown in FIG. 4, the openings CH5 and CH6 partially overlap each other in planar view, but the openings CH5 and CH6 may not necessarily overlap in planar view or may completely overlap.

In the case where, as shown in FIG. 4, the shape of the pixel PX is a rectangle and the sub-pixels SPR, SPG and SPB are arranged in a triangular manner at the positions corresponding to three of the four vertices of the rectangle, it is preferable that the openings CH5 and CH6 should be formed at the position corresponding to the remaining one vertex.

Figure 5:
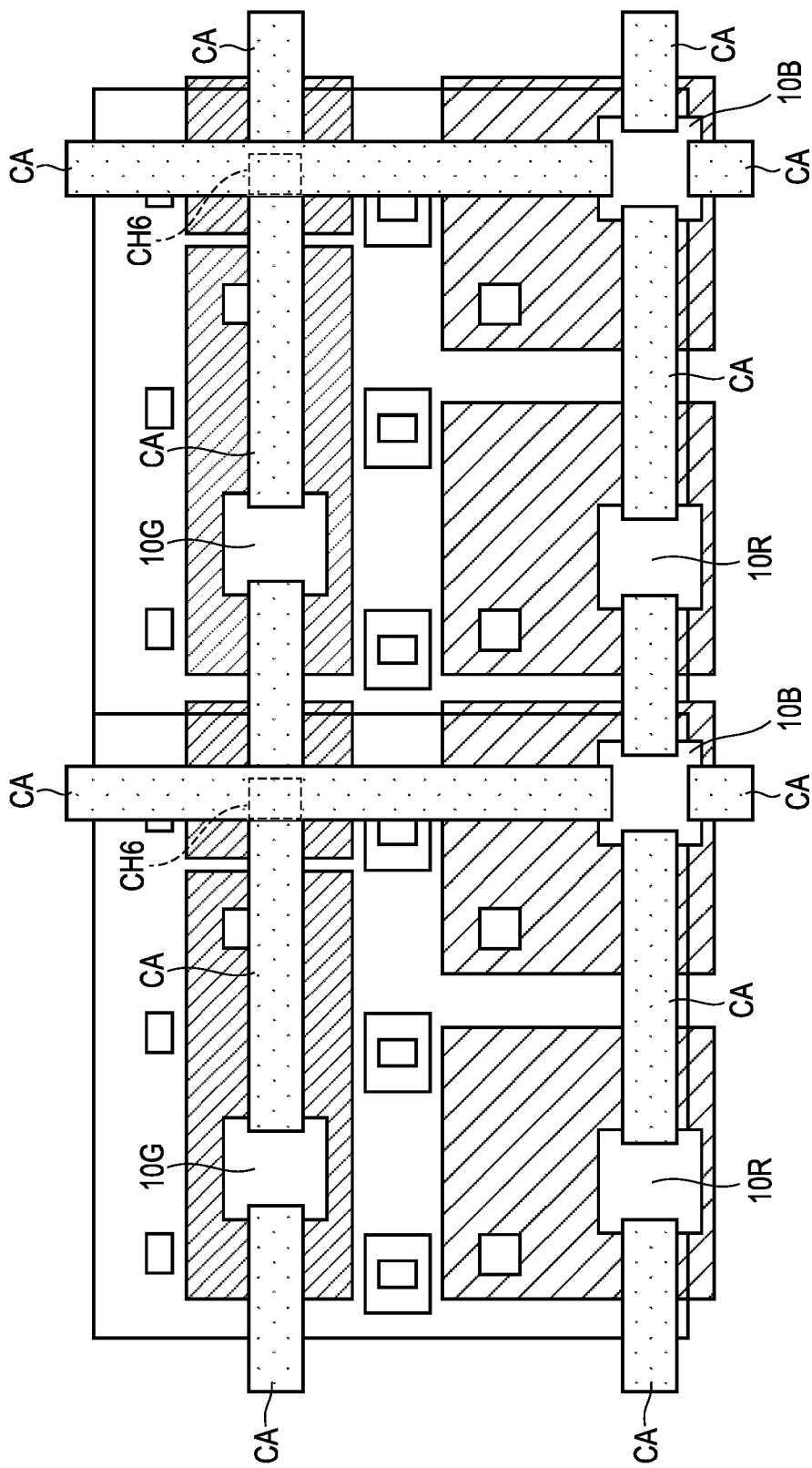
FIG. 5 is a plan view schematically showing an example of layout of cathode terminals of the display device of the embodiment.

Here, with reference to FIG. 5, the layout of the cathode terminals CA provided in the pixel PX will be explained. FIG. 5 illustrates, as an example, a layout in which the cathode terminals CA are mainly arranged to extend along the first direction X. The width and thickness of each cathode terminal CA are set according to the power required for the respective light-emitting element 10 to emit light and, for example, the width may be set to 10 μm and the thickness to 50 nm.

Specifically, one cathode terminal CA extends along the first direction X so as to connect an end portion of the emitting surface of the green light-emitting element 10G (a side of the rectangular emitting surface, which extends along the second direction Y) with an end portion of the emitting surface of the green light-emitting element 10G (a side of the rectangular emitting surface, which extends along the second direction Y) contained in an adjacent pixel PX arranged along the first direction X. In other words, the cathode terminal CA extends along the first direction X so as to connect both end portions of the emitting surface of the light-emitting element 10G with the end of the emitting surface of the light-emitting element 10G contained an adjacent pixel PX along the first direction X.

Another cathode terminal CA extends along the first direction X so as to connect one end of the emitting surface of the red light-emitting element 10R (a side close to the blue light-emitting element 10B in the same pixel PX, of the two end portions of the rectangular emitting surface, which extend along the second direction Y) with one end of the emitting surface of the blue light-emitting element 10B (a side close to the blue light-emitting element 10B in the same pixel PX, of the two end portions of the rectangular emitting surface, which extend along the second direction Y). Further, the cathode terminal CA extends along the first direction X so as to connect the other end of the emitting surface of the light-emitting element 10R (a side far from the light-emitting element 10B in the same pixel PX, of the two end portions of the rectangular emitting surface, which extend along the second direction Y) with an end portion of the emitting surface of the blue light-emitting element 10B (a side of the rectangular emitting surface, which extends along the second direction Y) contained in an adjacent pixel PX along the first direction X. Moreover, the cathode terminal CA extends along the first direction X so as to connect the other end portion of the emitting surface of the blue light-emitting element 10B (a side far from the light-emitting element 10R in the same pixel PX, of the two sides of the rectangular emitting surface, which extend along the second direction Y) with an end portion of the emitting surface of the red light-emitting element 10R (a side of the rectangular emitting surface, which extends along the second direction Y) contained in an adjacent pixel PX along the first direction X.

Furthermore, another cathode terminal CA extends along the second direction Y so as to connect an end portion of the emitting surface of the light-emitting element 10B (a side of the rectangular emitting surface, which extends along the first direction X) with an end portion of the emitting surface of the blue light-emitting element 10B (a side of the rectangular emitting surface, which extends along the first direction X) contained in an adjacent pixel PX along in the second direction Y. In other words, the cathode terminal CA extends along the second direction Y so as to connect both ends of the emitting surface of the light-emitting element 10B with an end of the emitting surface of the light-emitting element 10B contained in another pixel PX adjacent thereto along the second direction Y.

The cathode terminal CA extending from the green light-emitting element 10G to another pixel PX adjacent thereto along the first direction X and the cathode terminal CA extending from the blue light-emitting element 10B to another pixel PX adjacent thereto along the second direction Y intersect in the region where the opening CH6 is formed in planar view.

In the case where, as shown in FIG. 5, the cathode terminals CA are mainly arranged to extend along in the first direction X, the light extraction efficiency with respect to the first direction X is slightly lowered due to the arrangement of the cathode terminals CA; however such an advantage is obtained that the light extraction efficiency with respect to the second direction Y can be improved.

Next, with reference to FIG. 6, another layout of the cathode terminals CA provided in the pixels PX will be explained. Unlike the case of FIG. 5, FIG. 6 illustrates, as an example, a layout in which the cathode terminals CA are mainly arranged to extend along the second direction Y.

More specifically, one cathode terminal CA extends along the first direction X between the green light-emitting element 10G and the red light-emitting element 10R and between the opening CH6 and the blue light-emitting element 10B, contained in each of a number of pixels PX arranged along the first direction X.

Another cathode terminal CA extends along the second direction X so as to connect one end of the emitting surface of the light-emitting element 10G (a side close to the red light-emitting element 10R in the same pixel PX, of the two sides of the rectangular emitting surface, which extend along the first direction X) with one end of the emitting surface of the light-emitting element 10R (a side close to the green light-emitting element 10G in the same pixel PX, of the two sides of the rectangular emitting surface, which extend along the first direction X). Further, another cathode terminal CA extends along the second direction Y so as to connect the other one end of the emitting surface of the light-emitting element 10R (a side far from the light-emitting element 10R in the same pixel PX, of the two sides of the rectangular emitting surface, which extend along the first direction X) with an end portion of the emitting surface of the red light-emitting element 10R (a side of the rectangular emitting surface, which extends along the first direction X) contained in an adjacent pixel PX along the second direction Y. Moreover, another cathode terminal CA extends along the second direction Y so as to connect the other end of the emitting surface of the light-emitting element 10R (a side far from the light-emitting element 10G in the same pixel PX, of the two sides of the rectangular emitting surface, which extend along the first direction X) with an end portion of the emitting surface of the green light-emitting element 10G (a side of the rectangular emitting surface, which extends along the first direction X) contained in an adjacent pixel PX along the second direction Y.

Figure 6:
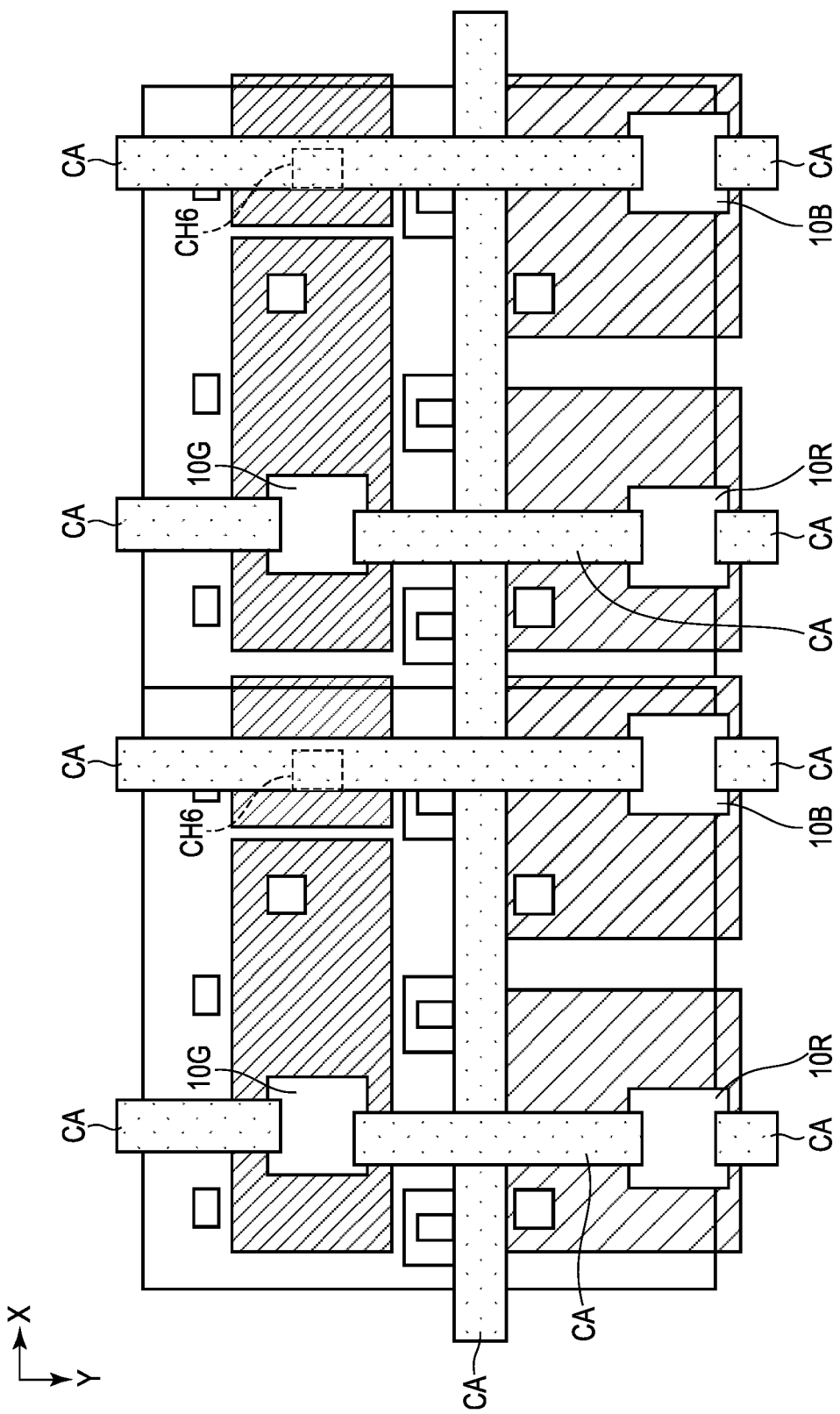
FIG. 6 is a plan view schematically showing another example of layout of cathode terminals of the display device of the embodiment.

As shown in FIG. 6, the cathode terminal CA extending from the green light-emitting element 10G to the red light-emitting element 10R in the same pixel PX and the cathode terminal CA extending along the first direction X naturally intersect each other in planar view.

Another cathode terminal CA extends along the second direction Y so as to connect an end portion of the emitting surface of the light-emitting element 10B (a side of the rectangular emitting surface, which extends along the first direction X) with an end portion of the blue light-emitting element 10B (a side of the rectangular emitting surface, which extends along the first direction X) contained in an adjacent pixel PX along the second direction Y and to pass through the opening CH6. In other words, the cathode terminal CA extends along the second direction Y so as to connect both end portions of the emitting surface of the light-emitting element 10B to an end portion of the emitting surface of the light-emitting element 10B contained in another pixel PX adjacent thereto along the second direction Y and to pass through the opening CH6.

As shown in FIG. 6, the cathode terminal CA extending from the blue light-emitting element 10B to the blue light-emitting element 10B contained in another pixel PX adjacent thereto along the second direction Y and the cathode terminal CA extending along the first direction X naturally intersect each other in planar view.

In the case where, as shown in FIG. 6, the cathode terminals CA are mainly arranged to extend along in the second direction Y, the light extraction efficiency with respect to the second direction Y is slightly lowered due to the arrangement of the cathode terminals CA; however such an advantage is obtained that the light extraction efficiency with respect to the first direction X can be improved.

Here, in the case of the layout shown in FIG. 5, the cathode terminals CA are in contact with the blue light-emitting element 10B by the four sides, which may make it difficult to extract the blue output light. On the other hand, in the layout shown in FIG. 6, the light-emitting elements 10R, 10G and 10B of any color are in contact with the cathode terminals CA, respectively, in two end portions, and the cathode terminals CA are not in contact therewith by the four sides. With this structure the possibility in which it is difficult to extract emission light of a particular color can be lowered.

Further, in the layout shown in FIG. 5, voltage is supplied to the cathode terminal CA of the red light-emitting element 10R via the cathode terminal CA of the blue light-emitting element 10B (bridged), and therefore the voltage applied between the light-emitting element 10R and that of the light-emitting elements 10G and 10B may be slightly different from each other. However, in the case of the layout shown in FIG. 6, voltage is equally supplied to the light-emitting elements 10R, 10G and 10B of any color via the cathode terminals CA extending along the first direction X, thus suppressing the possibility of applying different voltages as described above.

In the following descriptions, a comparative example will be provided to explain the effects of the display device 1 of this embodiment. The comparative example is designed to illustrate some of the effects exhibited by the display device 1 according to the embodiments, and do not exclude the configurations and effects that are common between the comparative example and the embodiments, from the scope of the present invention.

Figure 7:
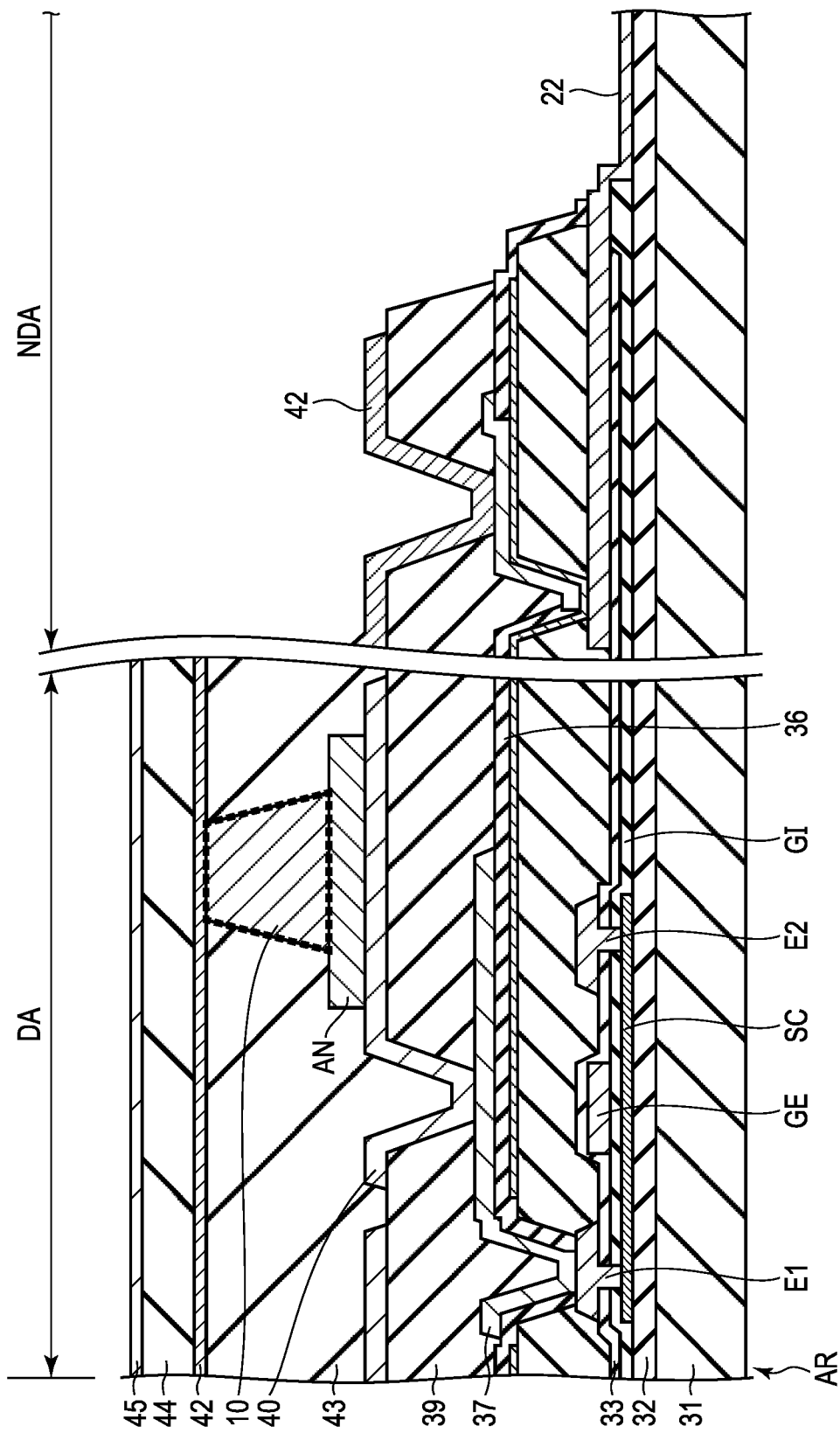
FIG. 7 is a diagram schematically showing an example of a cross-sectional structure of the display device of a comparative example.

FIG. 7 schematically shows a cross-sectional structure of a display device 100 according to the comparative example. The display device 100 of the comparative example is different from the display device 1 of the above-provided embodiment in that the cathode terminal CA is connected to the power wiring line in the non-display area NDA on an outer side of the display area DA, and the cathode terminal CA is formed of a transparent conductive material.

In the display device 100 of the comparative example, the cathode terminal CA of the light-emitting element 10 contained in each pixel PX is formed of a transparent conductive material such as ITO, the cathode terminal CA is shared by a number of pixels PX, and the voltage supplied from the power wiring line provided in the non-display area NDA is applied to the cathode terminal CA. In this case, there rises such a drawback that a voltage drop based on the resistance of ITO may occur to lower the voltage to be applied to the cathode terminal CA as the light-emitting element 10 is located farther from the power wiring line provided in the non-display area NDA (for example, the light-emitting elements 10 located near the central portion of the display area DA).

In contrast, in the display device 1 of this embodiment, the common power wiring line 22 (cathode wiring line), which corresponds to the power wiring line described above, is provided for each pixel PX, and therefore the low resistance can be achieved. Thus, the possibility of occurrence of the voltage drop described above can be suppressed.

Further, in the display device 1 of this embodiment, the cathode terminals CA are formed of a metal material such as titanium or a blackened metal, not from a transparent conductive material such as ITO. Therefore, even a lower resistance can be achieved as compared to the display device 100 of the comparative example, and the possibility of occurrence of the voltage drop described above can be further suppressed.

Furthermore, as shown in FIGS. 5 and 6, the display device 1 of this embodiment can change the light extraction efficiency by changing on the layout of the cathode terminals CA. Therefore, it can achieve a further advantage of being able to meet a wide variety of needs of the users.

According to one embodiment described above, it is possible to provide a display device 1 that can suppress the voltage drop which may occur in the light-emitting element 10 (micro LED) in which the anode terminals AN and the cathode terminals CA are arranged to oppose each other.

Based on the display device described above as an embodiment of the present invention, all display devices that may be designed and modified by those skilled in the art as appropriate and implemented also belong to the scope of the present invention as long as they include the essence of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion and alternation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
a substrate;
a light-emitting element mounted on the substrate;
an anode terminal disposed on an bottom portion of the light-emitting element;
a cathode terminal disposed on an emitting surface of the light emitting element, on an opposite side to the anode terminal;
a transparent conductive layer; and
a cathode relay electrode, wherein
the cathode terminal is formed of a metal material,
the cathode terminal overlaps an end portion of the emitting surface without overlapping a central portion of the emitting surface,
the transparent conductive layer is disposed on the cathode terminal and the central portion of the emitting surface,
the cathode relay electrode is in contact with the cathode terminal directly.

2. The display device of claim 1, further comprising:
a plurality of pixels each including the light emitting element, the anode terminal and the cathode terminal; and
a cathode wiring line provided in each of the plurality of pixels, for supplying a voltage applied to the cathode terminal.

3. The display device of claim 2,
wherein
the cathode terminal is electrically connected to the cathode wiring line via the cathode relay electrode, and
the cathode relay electrode is located in a same layer as that of the anode terminal.

4. The display device of claim 3, further comprising:
an anode wiring line which supplying a voltage applied to the anode terminal; and
an anode relay electrode,
wherein
the anode terminal is electrically connected to the anode wiring line via the anode relay electrode, and
the anode relay electrode and the cathode relay electrode are located in a same layer without overlapping each other in planar view.

5. The display device of claim 3, wherein
the cathode terminal extends along a first direction so as to connect the end portion of the emitting surface with an end portion of an emitting surface of an light-emitting element adjacent along the first direction parallel to a short side of the display device and to overlap a contact portion in contact with the cathode relay electrode in planar view.

6. The display device of claim 3, wherein
the cathode terminal extends along a second direction so as to connect the end portion of the emitting surface with an end portion of an emitting surface of an light-emitting element adjacent along the second direction parallel to a long side of the display device and to overlap a contact portion in contact with the cathode relay electrode in planar view.

7. The display device of claim 3, wherein
the pixel has a rectangular shape,
red, green, and blue light-emitting elements are arranged in a triangular fashion at positions corresponding to three of four vertices of the rectangular shape, and
a contact portion which electrically connects the cathode terminal and the cathode relay electrode is arranged at a position corresponding to one vertex different from the three vertices.

* * * * *